United States Patent
Ge et al.

(10) Patent No.: US 9,911,490 B2
(45) Date of Patent: Mar. 6, 2018

(54) MEMORY CONTROLLERS

(71) Applicant: Hewlett Packard Enterprise Development LP, Houston, TX (US)

(72) Inventors: Ning Ge, Palo Alto, CA (US); Jianhua Yang, Palo Alto, CA (US); Frederick Perner, Santa Barbara, CA (US); Janice H. Nickel, Pacifica, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/314,687

(22) PCT Filed: May 30, 2014

(86) PCT No.: PCT/US2014/040115
§ 371 (c)(1),
(2) Date: Nov. 29, 2016

(87) PCT Pub. No.: WO2015/183291
PCT Pub. Date: Dec. 3, 2015

(65) Prior Publication Data
US 2017/0200494 A1 Jul. 13, 2017

(51) Int. Cl.
G11C 13/00 (2006.01)

(52) U.S. Cl.
CPC ........ G11C 13/004 (2013.01); G11C 13/0007 (2013.01); *G11C 2013/0045* (2013.01)

(58) Field of Classification Search
CPC .......................... G11C 13/0045; G11C 13/004
USPC ........................................................ 365/148
See application file for complete search history.

(56) References Cited

U.S. PATENT DOCUMENTS

| 6,504,750 | B1 * | 1/2003 | Baker ..................... G11C 11/16 365/148 |
| 6,574,129 | B1 | 6/2003 | Tran |
| 6,937,507 | B2 * | 8/2005 | Chen .................. G11C 13/0004 257/E27.004 |

(Continued)

OTHER PUBLICATIONS

International Searching Authority, The International Search Report and the Written Opinion, PCT/US2014/040115, dated Jan. 28, 2015, 14 Pages.

(Continued)

*Primary Examiner* — Son Mai
(74) *Attorney, Agent, or Firm* — Hewlett Packard Enterprise Patent Department

(57) ABSTRACT

A memory controller includes a voltage control module that operates to isolate a target memristor of a memory crossbar array. The voltage control module applies a column voltage to a column line coupled to the target memristor, applies a first row voltage to all row lines not coupled to the target memristor and a second row voltage to a row line coupled to the target memristor, and senses a current through the target memristor to determine a state of the target memristor. The memory crossbar array includes a plurality of column lines, a plurality of row lines, a plurality of memristors, and a plurality of shorting switches. Each memristor is coupled between a unique combination of one column line and one row line. Each shorting switch has a high impedance resistor and a low impedance transistor, and each shorting switch is coupled to an end of a unique row line.

11 Claims, 3 Drawing Sheets

(56) References Cited

U.S. PATENT DOCUMENTS

| | | | |
|---|---|---|---|
| 7,286,378 B2 | 10/2007 | Nazarian | |
| 7,372,753 B1 * | 5/2008 | Rinerson | G11C 11/16 |
| | | | 365/148 |
| 7,960,770 B2 | 6/2011 | Mikawa et al. | |
| 8,451,648 B2 | 5/2013 | Kamoshida et al. | |
| 2008/0172385 A1 | 7/2008 | Mouttet | |
| 2011/0286259 A1 * | 11/2011 | Perner | G11C 5/063 |
| | | | 365/148 |
| 2011/0310656 A1 | 12/2011 | Kreipl et al. | |
| 2012/0307542 A1 | 12/2012 | Siau et al. | |
| 2013/0208532 A1 | 8/2013 | Meade | |
| 2013/0223134 A1 * | 8/2013 | Yi | G11C 13/0007 |
| | | | 365/148 |

OTHER PUBLICATIONS

Yakopcic, C. et al., Hybrid Crossbar Architecture for a Memristor Based Memory [online], Apr. 9, 2013, Retrieved Mar. 14, 2014, 5 Pgs.

* cited by examiner

MEMORY CONTROLLERS

BACKGROUND

Memory controllers are devices that can operate a memory device, such as memristor-based memories. Memristor-based memories may involve crossbar arrays of memristors. Memristors are devices that can be programmed to different resistive states by applying a programming energy, such as a voltage. After programming, the state of the memristor can be read and remains stable over a specified time period. Thus, memristors can be used to store digital data. For example, a high resistance state can represent a digital "0" and a low resistance state can represent a digital "1." Large crossbar arrays of memristive elements can be used in a variety of applications, including random access memory, non-volatile solid state memory, programmable logic, signal processing control systems, pattern recognition, and other applications.

BRIEF DESCRIPTION OF THE DRAWINGS

The following detailed description references the drawings, wherein.

DETAILED DESCRIPTION

Memristors are devices that may be used as components in a wide range of electronic circuits, such as memories, switches, radio frequency circuits, and logic circuits and systems. In a memory structure, a crossbar array of memristors or memristive devices may be used. When used as a basis for memories, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("ON") and one in which the channel forms a less conductive path ("OFF"). In some other cases, conductive paths represent "OFF" and less conductive paths represent "ON". Conducting channels may be formed by ions and/or vacancies.

Using memristors in crossbar arrays may lead to read and/or write failure due to sneak currents passing through the cells that are not selected—for example, cells on the same row or column as a targeted cell. Failure may arise when the total sneak current through untargeted neighboring cells from an applied voltage is higher than the current through the targeted memristor. Using a transistor or selector with each memristor has been proposed to isolate each cell and overcome the sneak current. However, using a transistor or selector with each memristor in a crossbar array limits array density and increases cost, which may impact the commercialization of memristive devices. In some applications, such as memristors on print heads, device architecture modifications may not be an effective solution. Thus, some effort has been spent in identifying alternative solutions for mitigating the sneak current problem.

Examples disclosed herein provide for memory controllers for isolating memristors of a memory crossbar array. In example implementations, memory controllers have a voltage control module that operates to isolate a target memristor by applying equipotential voltage to all memristors connected to the same row line or the same column line as the target memristor. Without subscribing to any particular theory, little or no current flows through a component when the voltage difference across the component is zero or minimal. Accordingly, by applying equipotential voltage across the other memristors, the target memristor may be virtually isolated.

In this manner, isolating a target memristor in a crossbar array may mitigate the impact of sneak currents on reading the targeted memristor. Additionally, the size of crossbar arrays may be minimized by avoiding the use of added selectors, transistors, or other components. These features may allow the creation of highly integrated memory architectures, particularly within certain design and size limitations.

Figure 1:
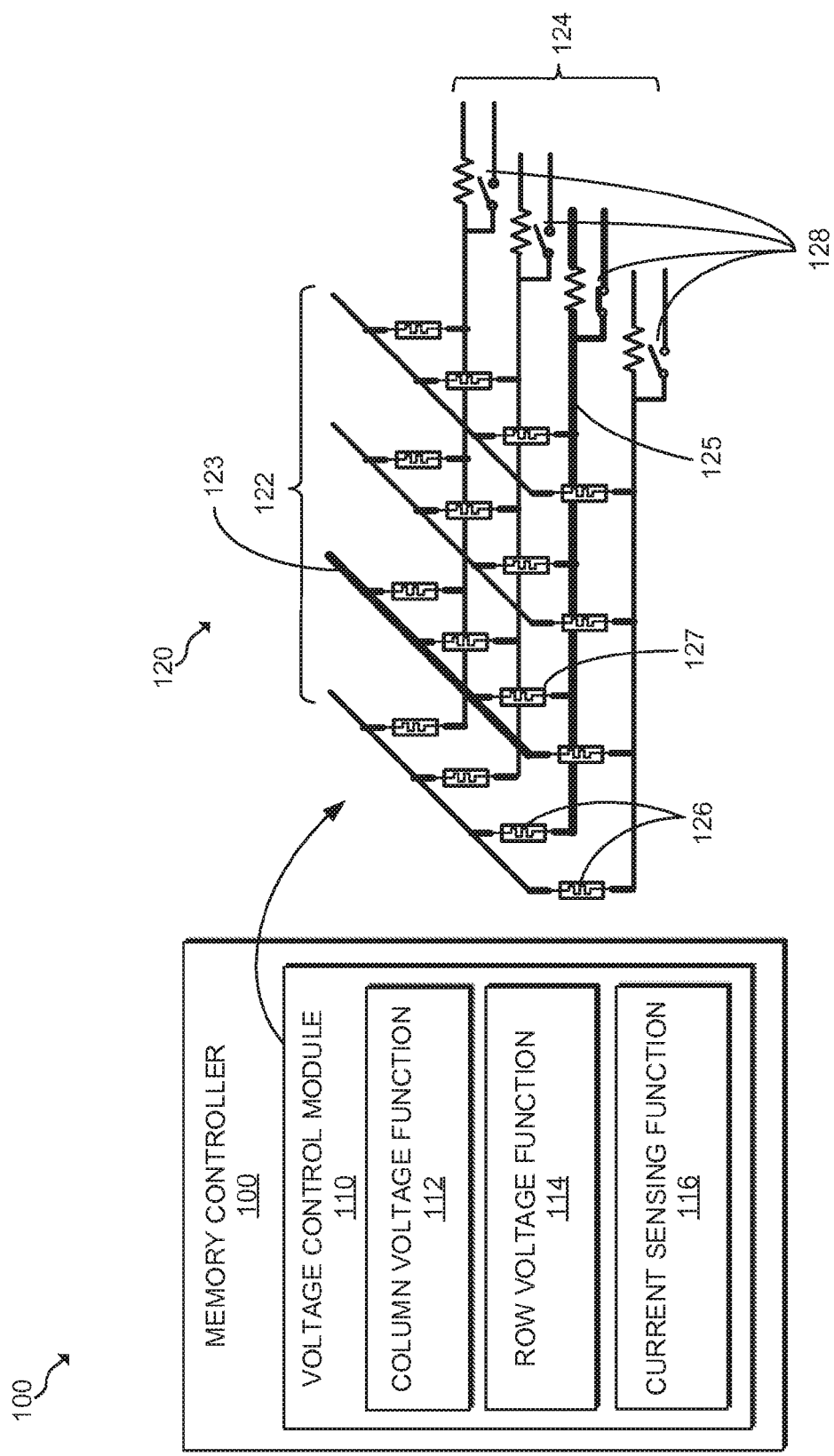
FIG. 1 is a block diagram of an example memory controller for isolating memristors in a memory crossbar array and a schematic of an example memory crossbar array.

Referring now to the drawings, FIG. 1 depicts an example memory controller 100 having a voltage control module 110 that operates to isolate a target memristor 127 of a memory crossbar array 120 for a read operation. Memory controller 100 may have a column voltage function 112 for applying a column voltage to a column line 123 coupled to a target memristor 127, a row voltage function 114 for applying a first row voltage to all row lines 124 not coupled to target memristor 127 and applying a second row voltage to a row line, depicted here as row line 125, coupled to target memristor 127, and a current sensing function 116 for sensing a current passing through target memristor 127 to determine the state of target memristor 127. Memory crossbar array 120 may have a plurality of column lines 122, a plurality of row lines 124, a plurality of memristors 126, and a plurality of shorting switches 128.

Memory controller 100 may be an electrical device or component that, in addition to other functions, operates or controls a memory device. The implementation of memory controller 100 may include hardware-based components, such as a microchip, chipset, or electronic circuit, and software-driven components, such as a processor, microprocessor, or some other programmable device. In some examples, memory controller 100 may be a circuit having a multiplexer that may direct voltage or current to specific lines within an array, such as memory crossbar array 120.

Memory controller 100 may have voltage control module 110, which may operate to isolate a target memristor of a crossbar array. Voltage control module 100 may include an instruction, set of instructions, process, operation, logic, technique, function, firmware, and/or software executable by memory controller 100. Voltage control module 110 may isolate target memristor 127 of memory crossbar array 120 by the operation of column voltage function 112, row voltage function 114, and current sensing function 116.

Memory crossbar array 120 may be a configuration of parallel and perpendicular lines with memory cells coupled between lines at cross-points. Such an architecture is generally referred to as a crossbar or cross-point array. Memory crossbar array 120 may include a plurality of column lines 122, a plurality of row lines 124, a plurality of memristors 126, and a plurality of shorting switches 128. Each memristor 126 may function as a memory cell within memory crossbar array 120.

Column lines 122 may be electrically conducting lines that carry current throughout memristor crossbar array 120. Column lines 122 may be in parallel to each other, generally with equal spacing. Column lines 122 may sometimes be referred to as bit lines. Depending on orientation, column lines 122 may alternatively be referred to as word lines. Similarly, row lines 124 may be conducting lines that run perpendicular to column lines 122. Row lines 124 may be referred to as word lines in some conventions. In other orientations, row lines 124 may refer to bit lines. Column lines 122 and row lines 124 may be made of conducting materials, such as platinum (Pt), tantalum (Ta), hafnium (Hf), zirconium (Zr), aluminum (Al), cobalt (Co), nickel (Ni), iron (Fe), niobium (Nb), molybdenum (Mo), tungsten (W), copper (Cu), titanium (Ti), tantalum nitrides ($TaN_x$), or titanium nitrides ($TiN_x$).

Memristors 126 may be coupled between column lines 122 and row lines 124, which may mean forming a continuous electrical connection between a column line 122, a memristor 126, and a row line 124. Each memristor 126 may be between a unique combination of one column line 122 and one row line 124. In other words, no two memristors 126 share both a column line 122 and row line 124. In such a manner, each memristor 126 may function as a memory cell in crossbar array 120. A memristor 126 may be an electrical component that may change resistance when a voltage is applied across it or a current is driven through it. Furthermore, a memristor 126 may "memorize" its last resistance. In this manner, each memristor 126 may be set to at least two states.

Memristors 126 may be based on a variety of materials. Each memristor 126 may be oxide-based, meaning that at least a portion of the memristor is formed from an oxide-containing material. Each memristor 126 may also be nitride-based, meaning that at least a portion of the memristor is formed from a nitride-containing composition. Furthermore, each memristor 126 may be oxy-nitride based, meaning that a portion of the memristor is formed from an oxide-containing material and that a portion of the memristor is formed from a nitride-containing material. In some examples, a memristor 126 may be formed based on tantalum oxide ($TaO_x$) or hafnium oxide ($HfO_x$) compositions. Other example materials of memristors 126 may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning memristors may be employed in the practice of the teachings herein.

Each memristor 126 may have electrodes on each end that serve to couple the memristor to a column line 122 and a row line 124. Electrodes may generally have an electrically conducting material in order to create an electrical path with the column line 122 and the row line 124. Example materials for electrodes of memristor 126 may include metals such as platinum or other conducting material such as tantalum nitrides and titanium nitrides.

Shorting switches 128 may be coupled to the end of row lines 124. A shorting switch 128 may be a device that impacts the amount of current that may pass through a line coupled to the shorting switch. A shorting switch 128 may have a high impedance resistor and a low impedance transistor. A shorting switch 128 may short the row line 124 to which it is coupled by switching the low impedance transistor. Row lines 124 not coupled to target memristor 127 may have the shorting switch set so a current resulting from the first row voltage will go through the high impedance resistor, which may reduce or alter the current going through each row line 124. In one example, shorting switch 128 may have a pass transistor circuit that serves as the logic gate driving the switching function. It should be noted that while example memory crossbar array 120 is shown with shorting switches 128 coupled to the ends of row lines 124, in some other examples, shorting switches 128 may be coupled to column lines 122.

Voltage control module 110 may isolate target memristor 127 by applying the equipotential principle described above. To do so, voltage control module 110 may utilize the operation of column voltage function 112, row voltage function 114, and current sensing function 116. Column voltage function 112 may apply a voltage, such as a read voltage, to drive a current to the column line 123 that is coupled to target memristor 127, which is the memory cell being read, for example. In one example, column voltage function 112 directs a multiplexer circuit of memory controller 100 to direct the current to column line 123. However, the current may not solely pass through target memristor 123. Instead, various amounts of current may sneak through the other memristors 126 that are coupled to column line 123.

To isolate target memristor 123, row voltage function 114 may apply a first row voltage to all row lines 124 that are not coupled to target memristor 127. The row line coupled to target memristor 127 is depicted in FIG. 1 by row line 125. By applying the first row voltage to row lines 124, the voltage drop across the untargeted memristors 126 may be reduced or eliminated, which in turn reduces or eliminates the current flow through each memristor 126. As described above, current is a function of voltage drop by the following equation:

$$I=\Delta V/R \quad \text{[Equation 1]},$$

where:
I is the current across the memristor,
$\Delta V$ is the voltage difference across the memristor, and
R is the resistance of the memristor.

When the voltage difference, $\Delta V$, is zero, the current through memristor 126 is also zero. In some example implementations, the first row voltage applied by row voltage function 114 may be the same voltage as the voltage applied by column voltage function 112. In such examples, $\Delta V$ may be zero and the resulting current through the coupled memristor 126 may also be zero. In some other examples, the first row voltage applied by row voltage function 114 may be half of the column voltage applied by column voltage function 112.

Row voltage function 114 may also apply a second row voltage to row line 125 coupled to target memristor 127. The second row voltage may be a ground voltage. The ground voltage may create a voltage drop across target memristor 127 that is equal or close to the column voltage applied by column voltage function 112. Grounding row line 125 coupled to target memristor 127 may allow controlling the column voltage to drive a desired read current through target memristor 127.

Current sensing function 116 may sense a current passing through target memristor 127. In some examples, the current may be used to read target memristor 127 by determining the resistance state of target memristor 127. Current sensing function 116 may employ a sensor or sensors connected to column lines 122 or row lines 124 or both. In some implementations, a current that is sensed by current sensing function 116 may include additional currents, such as sneak currents from other row lines 124 as a result of the row voltages applied by row voltage function 114. Current sensing function 116 may filter additional currents and accurately sense the read current for target memristor 127.

In some implementations, voltage control module 110 may further include a function for shorting the shorting switches 128. Shorting the switch 128 coupled to row line 125 coupled to target memristor 127 may make row line 125 conducting for both the read current from the column voltage and also sneak currents from the first row voltages. Doing so prevents the equipotential effect on target memristor 127. Accordingly, a read current may pass through target memristor 127 by the column voltage applied by column voltage function 112.

Figure 2:
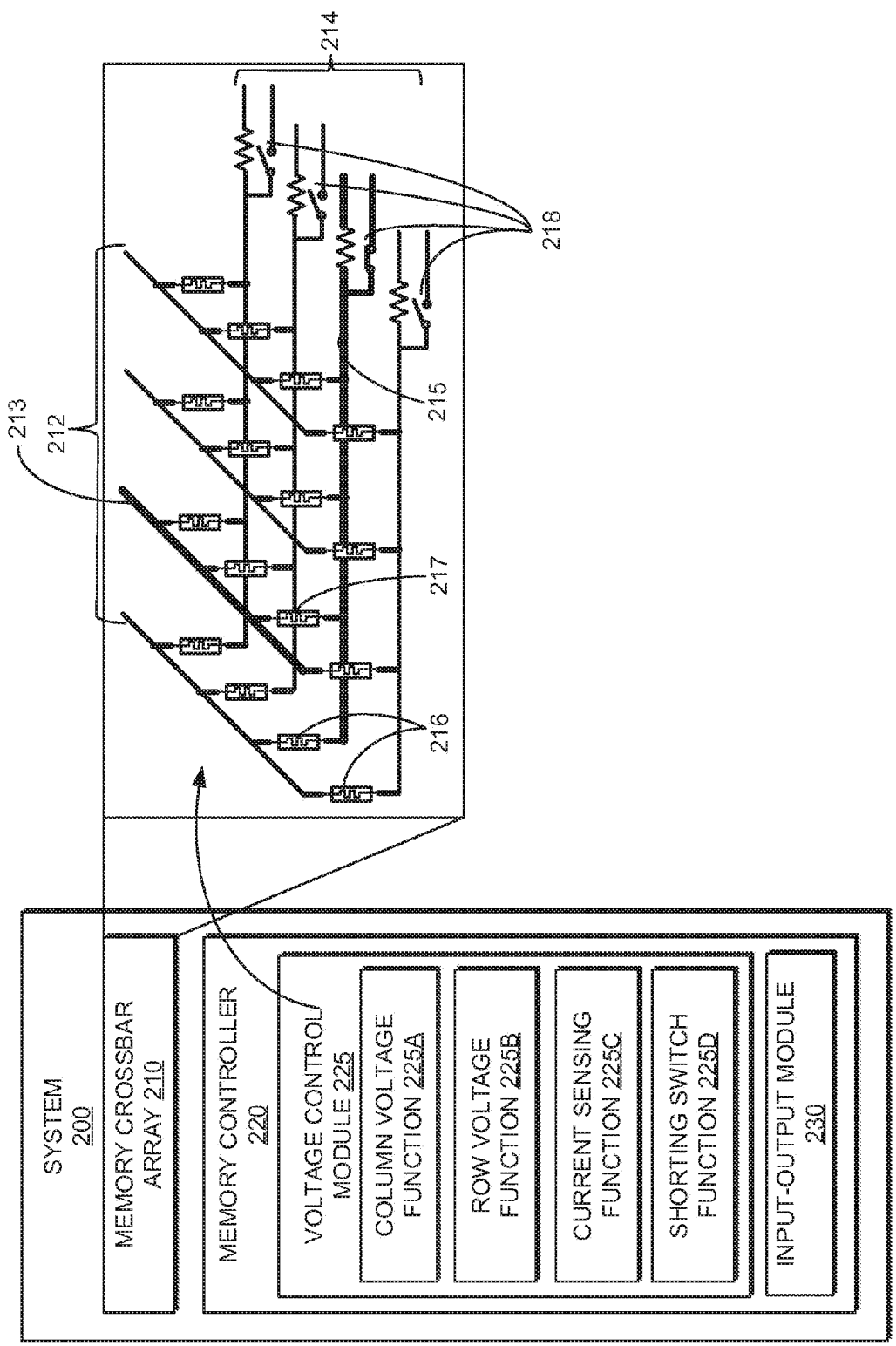
FIG. 2 is a block diagram of an example system having a memory controller for isolating memristors in a memory crossbar array.

FIG. 2 depicts an example system 200 having a memory controller 220 for isolating memristors 216 in a memory crossbar array 210. Memory crossbar array 210 may have a plurality of column lines 212, a plurality of row lines 214, a plurality of memristors 216, and a plurality of shorting switches 218. Each memristor 216 may be coupled between a unique combination of one column line 212 and one row line 214. Each shorting switch 218 may be coupled to an end of a unique row line 214. Memory controller 220 may have a voltage control module 225 that operates to isolate target memristor 217 in memory crossbar array 210.

Similar to memory controller 100 of FIG. 1, memory controller 220 may be an electrical device or component that, in addition to other functions, operates or controls a memory device. The implementation of memory controller 220 may include hardware-based components, such as a microchip, chipset, or electronic circuit, and software-driven components, such as a processor, microprocessor, or some other programmable device. In some examples, memory controller 220 may be a circuit having a multiplexer that may direct voltage or current to specific lines within an array, such as memory crossbar array 210.

Memory controller 220 may have voltage control module 225, which may operate to isolate a target memristor of a crossbar array. Voltage control module 225 may include an instruction, set of instructions, process, operation, logic, technique, function, firmware, and/or software executable by memory controller 220. Voltage control module 225 may isolate target memristor 217 of memory crossbar array 210 by the operation of column voltage function 225A, row voltage function 225B, and current sensing function 225C.

Similar to memory crossbar array 120 of FIG. 1, memory crossbar array 210 may be a configuration of parallel and perpendicular lines with memory cells coupled between the lines at cross-points. Column lines 212 may be electrically conducting lines that carry current throughout memristor crossbar array 210. Column lines 212 may be in parallel to each other, generally with equal spacing. Column lines 212 may sometimes be referred to as bit lines. Depending on orientation, column lines 212 may alternatively be referred to as word lines. Relatedly, row lines 214 may be conducting lines that run perpendicular to column lines 212. Row lines 214 may be referred to as word lines in some conventions. In other orientations, row lines 214 may refer to bit lines. Column lines 212 and row lines 214 may be made of conducting materials, such as platinum (Pt), tantalum (Ta), hafnium (Hf), zirconium (Zr), aluminum (Al), cobalt (Co), nickel (Ni), iron (Fe), niobium (Nb), molybdenum (Mo), tungsten (W), copper (Cu), titanium (Ti), tantalum nitrides ($TaN_x$), or titanium nitrides ($TiN_x$).

Memristors 216 may be coupled between column lines 212 and row lines 214, which may mean forming a continuous electrical connection between a column line 212, a memristor 216, and a row line 214. Each memristor 216 may be between a unique combination of one column line 212 and one row line 214. In other words, no two memristors 216 share both a column line 212 and row line 214. In such a manner, each memristor 216 may function as a memory cell in crossbar array 210. A memristor 216 may be an electrical component that may change resistance when a voltage is applied across it or a current is driven through it. Furthermore, a memristor 216 may "memorize" its last resistance. In this manner, each memristor 216 may be set to at least two states. Various types of memristors may be employed in the practice of the teachings herein, including oxide-based memristors and nitride-based memristors.

Shorting switches 218 may be coupled to the end of row lines 214. A shorting switch 218 may be a device that impacts the amount of current that may pass through a line coupled to the shorting switch. In some implementations, a shorting switch 214 may have a high impedance resistor and a low impedance transistor. A shorting switch 218 may short the row line 214 to which it is coupled by switching the low impedance transistor. Row lines 214 not coupled to target memristor 217 may have the shorting switch set so a current resulting from the first row voltage will go through the high impedance resistor, which may reduce or alter the current going through each row line 214. In some examples, shorting switch 218 may have a pass transistor circuit that serves as the logic gate driving the switching function. It should be noted that while example memory crossbar array 210 is shown with shorting switches 218 coupled to the ends of row lines 214, in some other examples, shorting switches 218 may be coupled to column lines 212.

In some implementations, memory crossbar array 210 may further include a plurality of selectors. Each selector may be coupled in series with a unique memristor 216. Selector may be electrical components placed in series with memristors 216 that controls the overall electrical properties of the resulting combinations. In many examples, a selector coupled to memristor 216 may have current-voltage nonlinearity. In other words, when the voltage applied across the selector is changed, the current passing through the selector changes by a factor, "k". Generally, the factor "k" may be a function of voltage. Selectors in memory crossbar array 210 may be any type of selector. Examples may include crested tunnel barrier selectors and non-differential resistance selectors.

Similar to voltage control module 110 of FIG. 1, voltage control module 225 may isolate target memristor 217 by applying the equipotential principle. To do so, voltage control module 225 may utilize the operation of column voltage function 225A, row voltage function 225B, and current sensing function 225C. Column voltage function 225A may apply a voltage, such as a read voltage, to drive a current to the column line 213 that is coupled to target memristor 217, which is the memory cell being read, for example. In one example, column voltage function 225A directs a multiplexer circuit of memory controller 220 to direct the current to column line 213. However, the current may not solely pass through target memristor 213. Instead, various amounts of current may sneak through the other memristors 216 that are coupled to column line 213.

To isolate target memristor 217, row voltage function 225B may apply a first row voltage to all row lines 214 that are not coupled to target memristor 217. The row line coupled to target memristor 217 is depicted in FIG. 2 as row line 215. By applying the first row voltage to row lines 214, the voltage drop across the untargeted memristors 216 may be reduced or eliminated, which in turn reduces or eliminates the current flow through each memristor 216. As previously described, current is a function of voltage drop by Equation 1 above. According to Equation 1, when the voltage difference, ΔV, is zero, the current through a memristor 216 is also zero. In some example implementations, the first row voltage applied by row voltage function 225B may be the same voltage as the voltage applied by column voltage function 225A. In such examples, ΔV may be close to zero and the resulting current through the coupled memristor 216 may also be close to zero. In another example, the first row voltage applied by row voltage function 225B may be half of the column voltage applied by column voltage function 225A.

Row voltage function 225B may also apply a second row voltage to row line 215 coupled to target memristor 217. The second row voltage may be a ground voltage. The ground voltage may create a voltage drop across target memristor 217 that is equal or close to the column voltage applied by column voltage function 225A. Grounding row line 215 coupled to target memristor 217 may allow controlling the column voltage to drive a desired read current through target memristor 217.

Current sensing function 225C may sense a current passing through target memristor 217. In some examples, the current may be used to read target memristor 217 by determining the resistance state of target memristor 217. Current sensing function 225C may employ a sensor or sensors connected to column lines 212 or row lines 214 or both. In some implementations, a current that is sensed by current sensing function 225C may include additional currents, such as sneak currents from other row lines 214 as a result of the first row voltages applied by row voltage function 225B. Current sensing function 225C may filter additional currents and accurately sense the read current for target memristor 217.

In some implementations, voltage control module 225 may further include a function 225D for shorting the shorting switches 218. Shorting the switch 218 coupled to row line 215 coupled to target memristor 217 may make row line 215 conducting for both the read current from the column voltage and also sneak currents from the first row voltages. Doing so prevents the equipotential effect on target memristor 217. Accordingly, a read current may pass through target memristor 217 by the column voltage applied by column voltage function 225A.

In addition to voltage control module 225, in some examples, memory controller 220 may have an input-output module 230. Similar to voltage control module 225, input-output module 230 may include an instruction, set of instructions, process, operation, logic. technique, function, firmware, and/or software executable by memory controller 220. Input-output module 230 may operate to send and receive data, information, and/or signal between memory controller 220 and the other components of system 200. In addition or as an alternative, in some examples, input-output module 230 may send and receive data, information, and/or signal between system 200 and any devices to which system 200 is connected, operates with, or of which system 200 is a part. For example, input-output module 230 operates to send data to and from system 200 and a computer of which system 200 is a part. In general, input-output module 230 may allow communications between the components of system 200 and between system 200 and other devices or systems.

Figures 3A, 3B:
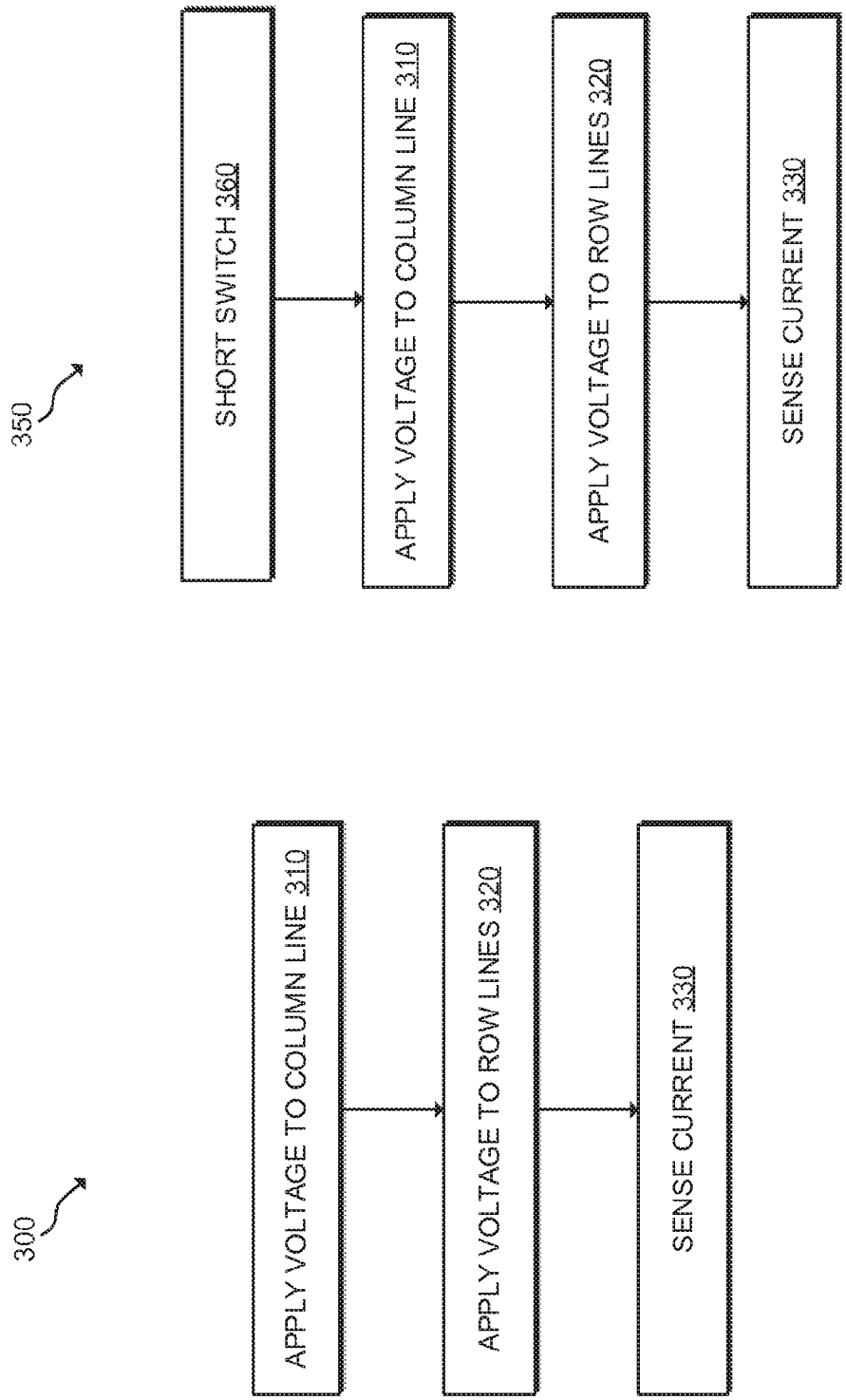
FIG. 3A is a flowchart of an example method for isolating a target memristor.
FIG. 3B is a flowchart of an example method for isolating a target memristor including shorting a switch.

FIG. 3A is a flowchart of an example method 300 for isolating a target memristor, which may include block 310 for applying a column voltage to a column line coupled to a target memristor of a memory crossbar array, block 320 for applying a first row voltage to all row lines of the memory array not coupled to the target memristor and a second row voltage to the row line coupled to the target memristor, and block 330 for sensing a current in the row line coupled to the target memristor to determine a state of the target memristor. Although execution of method 300 is herein described in reference to isolating a target memristor by the memory controller 100 of FIG. 1, other suitable parties for implementation of method 300 should be apparent, including, but not limited to, system 200 of FIG. 2.

Method 300 may start in block 310, where a column voltage is applied to column line 123 coupled to target memristor 127 of memory crossbar array 120. A column voltage may be applied via a memory controller, for example memory controller 100, by a voltage control module, such as voltage control module 110. A column voltage applied in block 310 may be a read voltage for reading the state of target memristor 127. A read voltage may be used to determine the resistance of target memristor 127.

After applying a column voltage, method 300 may proceed to block 320, where a first row voltage is applied to all row lines 124 not connected to target memristor 127 and a second row voltage is applied to row line 125 coupled to target memristor 127. Row voltages may be applied via a memory controller, for example memory controller 100, by a voltage control module, such as voltage control module 110. A first row voltage applied in block 320 may be the same voltage as the column voltage applied in block 310. In such instances, the sneak current through non-targeted memristors 126 on column 123 may be eliminated due to equipotential effect. In some other examples, a row voltage may be half the voltage of the column voltage applied in block 310. In such instances, the sneak currents through non-targeted memristors 126 on column 123 may be reduced due to equipotential effect. A second row voltage applied may be a ground voltage. Further details of the equipotential effect are described above in relation to row voltage function 114 of FIG. 1.

After applying a row voltage, method 300 may proceed to block 330, where a current through target memristor 127 is sensed in order to determine the state of target memristor 127. In some examples, the current may be sensed to read target memristor 127 by determining the resistance state of target memristor 127. Current may be sensed by a sensing function such as current sensing function 116. Current sensing function 116 may employ a sensor or sensors connected to column lines 122 or row lines 124 or both. In some implementations, a current that is sensed by current sensing function 116 may include additional currents, such as sneak currents from other row lines 124 as a result of the row voltages applied in block 310. Current sensing function 116 may filter additional currents and accurately sense the read current for target memristor 127.

FIG. 3B is a flowchart of an example method 350 for isolating a memristor, which further includes shorting a shorting switch. Method 350 may include method 300 and block 360 for shorting a shorting switch 128. Although execution of method 350 is herein described in reference to isolating target memristor 127 of memory crossbar array 120 as depicted in FIG. 1, other suitable parties for implementation of method 350 should be apparent, including, but not limited to, system 200 of FIG. 2.

In block 360, at least one shorting switch 128 may be shorted. Shorting the shorting switch 128 coupled to row line 125, which is in turn coupled to target memristor 127, may make row line 125 conducting for the addressing current from the column voltage. Furthermore, shorting the shorting switch 128 allows the second row voltage applied by row voltage function 114 to prevent or mitigate the equipotential effect on target memristor 127. Accordingly, a sensing current may pass through target memristor 127 by the column voltage applied by column voltage function 112.

What is claimed is:

1. A memory controller, comprising a voltage control module that operates to isolate a target memristor of a memory crossbar array by applying a column voltage to a column line coupled to the target memristor, applying a first row voltage to all row lines not coupled to the target memristor and a second row voltage to a row line coupled to the target memristor, and sensing a current through the target memristor to determine a state of the target memristor, wherein the memory crossbar array comprises:
a plurality of column lines;
a plurality of row lines;
a plurality of memristors, each memristor coupled between a unique combination of one column line and one row line; and
a plurality of shorting switches, each shorting switch coupled to an end of a unique row line, and each shorting switch comprising a high impedance resistor and a low impedance transistor, the voltage control module operating to short the shorting switch coupled to the row line coupled to the target memristor.

2. The memory controller of claim 1, wherein the voltage control module further operates to apply the first row voltage to each row line not coupled to the target memristor via the high impedance resistor of each row line's shorting switch and to apply a ground voltage as the second row voltage to a row line coupled to the target memristor via the low impedance transistor of the row line's the shorting switch.

3. The memory controller of claim 1, wherein the first row voltage is the same as the column voltage.

4. The memory controller of claim 1, wherein the first row voltage is half of the column voltage.

5. A system, comprising:
a memory crossbar array, wherein the memory crossbar array comprises a plurality of column lines, a plurality of row lines, and a plurality of memristors, each memristor coupled between a unique combination of one column line and one row line, and a plurality of shorting switches, each shorting switch coupled to an end of a unique row line, and each shorting switch comprising a high impedance resistor and a low impedance transistor; and
a memory controller, wherein the memory controller comprises a voltage control module that operates to isolate a target memristor by applying a column voltage to the column line coupled to the target memristor, applying a first row voltage to all row lines not coupled to the target memristor and a second row voltage to a row line coupled to the target memristor, and sensing a current through the target memristor to determine a state of the target memristor, the voltage control module operating to short the shorting switch coupled to the row line coupled to the target memristor.

6. The system of claim 5, wherein the voltage control module further operates to apply the first row voltage to each row line not coupled to the target memristor via the high impedance resistor of each row line's shorting switch and to apply a ground voltage as the second row voltage to a row line coupled to the target memristor via the low impedance transistor of the row line's shorting switch.

7. The system of claim 5, wherein the first row voltage is the same as the column voltage.

8. The system of claim 5, wherein the first row voltage is half of the column voltage.

9. The system of claim 5, wherein the memory controller further comprises an input-output module.

10. A method for isolating a target memristor, comprising:
applying a voltage to a column line coupled to a target memristor of a memory crossbar array, the memory crossbar array comprising a plurality of column lines, a plurality of row lines, a plurality of memristors, wherein each memristor is coupled between a unique combination of a column line and a row line, and a plurality of shorting switches, each shorting switch coupled to an end of a unique row line and each shorting switching comprising a high impedance resistor and a low impedance transistor;
applying a first row voltage to all row lines of the memristor crossbar array not coupled to the target memristor and a second row voltage to a row line coupled to the target memristor;
sensing a current through the target memristor to determine a state of the target memristor; and
applying the first row voltage to each row line not coupled to the target memristor via the high impedance resistor of each row line's shorting switch and applying a ground voltage as the second row voltage to a row line coupled to the target memristor via the low impedance transistor of the row line's shorting switch.

11. The method of claim 10, further comprising shorting the shorting switch coupled to the row line coupled to the target memristor.

* * * * *